United States Patent [19]
Aparin

[11] Patent Number: 6,150,852
[45] Date of Patent: Nov. 21, 2000

[54] ACTIVE DIFFERENTIAL TO SINGLE-ENDED CONVERTER

[75] Inventor: Vladimir Aparin, San Diego, Calif.

[73] Assignee: Qualcomm Incorporated, San Diego, Calif.

[21] Appl. No.: 09/231,852

[22] Filed: Jan. 14, 1999

[51] Int. Cl.[7] .................................................. H02M 11/00
[52] U.S. Cl. .......................................... 327/103; 327/427
[58] Field of Search .................................. 327/65, 66, 67, 327/103, 104, 427, 430, 431, 434, 435, 478, 298, 407, 408

[56] References Cited

U.S. PATENT DOCUMENTS 3,659,120  4/1972  Saeki ........................................ 327/478
5,903,177  5/1999  Schwab et al. ........................... 327/103

OTHER PUBLICATIONS

*Analysis and Design of Analog Integrated Circuits*, Third Edition, by Gray et al., Wiley & Sons Publishing., 1993, pp. 293–298.

*Primary Examiner*—Toan Tran
*Attorney, Agent, or Firm*—Philip R. Wadsworth; Charles D. Brown

[57] ABSTRACT

Many applications require the conversion of a differential current signal into a single-ended signal. The shortcomings encountered with existing approaches include poor conversion efficiency, limited bandwidth, and large size. The converter disclosed uses active devices to obtain a unit of small size and high efficiency having a wide bandwidth of operation.

25 Claims, 12 Drawing Sheets

ACTIVE DIFFERENTIAL TO SINGLE-ENDED CONVERTER

BACKGROUND OF THE INVENTION

1. Field of the Invention

This invention relates to circuits for converting or combining signals, and specifically to circuits for converting differential signals into single-ended signals. More specifically, this invention relates to the conversion of a differential alternating current signal into a single-ended signal.

2. Description of Related Art and General Background

Conversion of a differential signal to a single-ended signal is used in many different circuit applications. Due to their immunity to common-mode interferences, differential signals are often used to interconnect electronic devices. The differential signals are then converted to single-ended signals for transmission by wire or wireless means. Differential signals are also often used in frequency conversion devices to reject local oscillator leakage and other spurious responses.

Figure 1:
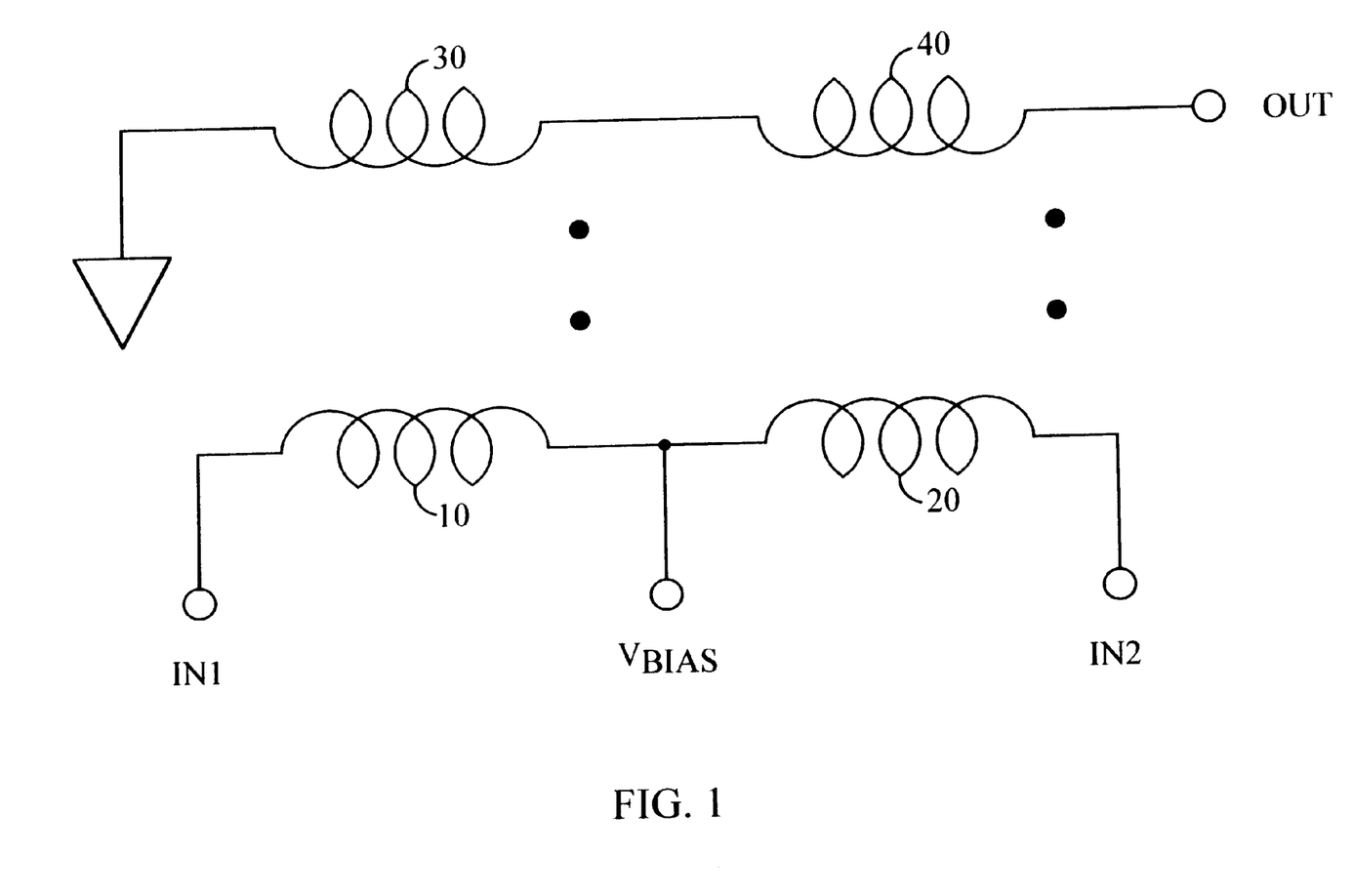
FIG. 1 is a first example of a converter in the related art.

A simple converter which uses an inductive transformer is illustrated in FIG. 1. With the inductors coupled as indicated, changes in the currents flowing through the primary coils 10 and 20 induce voltages across the secondary coils 30 and 40, respectively, according to the well-known relation $$v = M \times di/dt \qquad (1)$$

where M is a constant factor defining the degree of coupling between the primary and secondary coils. As a consequence of relation (1), the circuit of FIG. 1 operates by converting a time-varying difference between input currents IN1 and IN2 into an output voltage OUT. For most applications, coils 10 and 20 will be identical to each other, and coils 30 and 40 will also be identical to each other, so that each input signal will encounter the same impedance and will undergo conversion by the same factor M.

Figure 2:
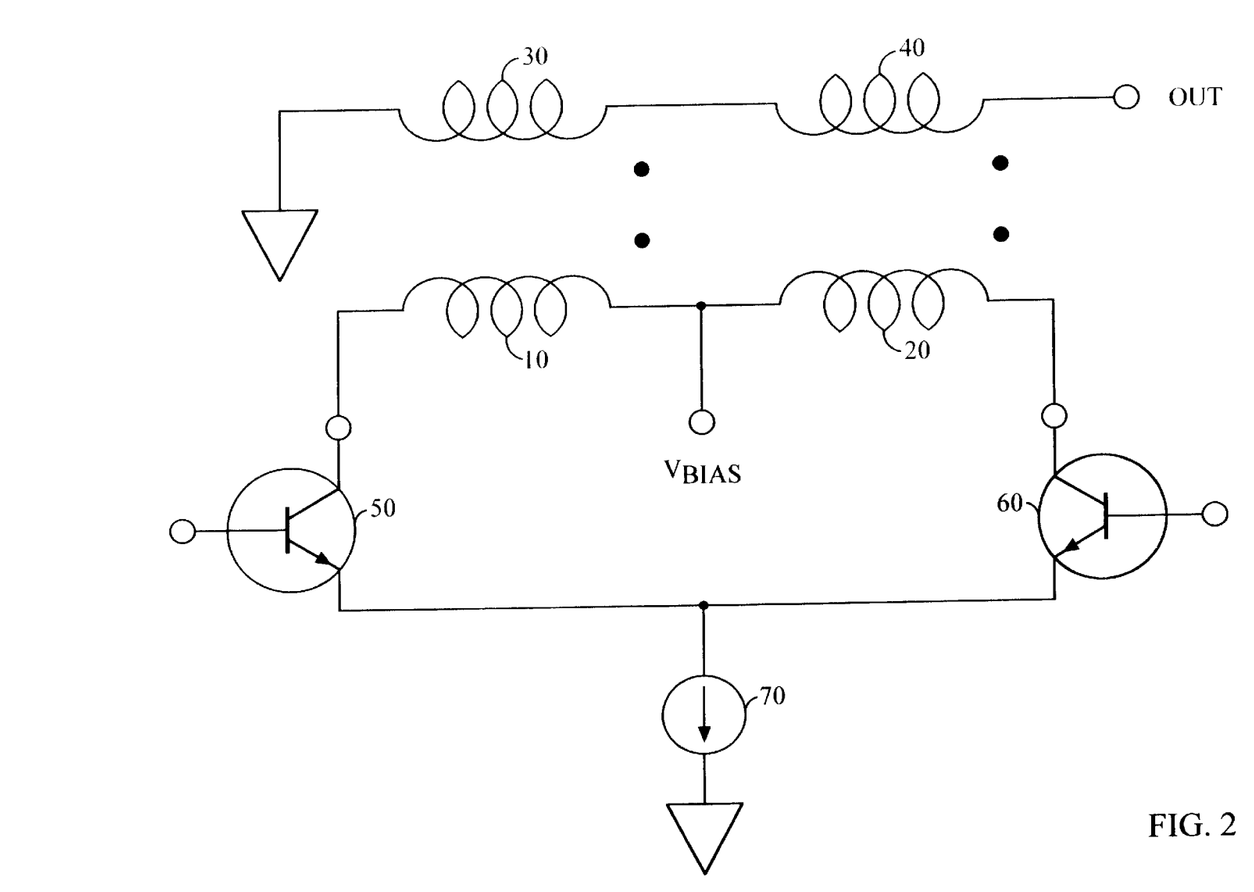
FIG. 2 is a representative application for the converter of FIG. 1.

FIG. 2 shows a representative use for such a converter. A differential voltage signal $\Delta$, having a (possibly zero) DC offset component $\Delta_{dc}$ and an small-signal AC component $\Delta_{ac}$, is inputted to the base terminals of a differential pair of active devices 50 and 60. The emitters of active devices 50 and 60 are connected together and biased by direct current source 70. The collectors of active devices 50 and 60 are biased through their connections to the terminals of the primary coils 10 and 20, between which coils is applied a DC bias voltage $V_{bias}$.

Because source 70 is assumed ideal, all AC current flow is confined to the loop formed by active devices 50 and 60 and the primary coils 10 and 20. As the amplitude of signal $\Delta_{ac}$ fluctuates between positive and negative, the bias current flows through the loop first in one direction and then in the other, inducing a corresponding AC voltage in the secondary windings according to relation (1) above.

The size of an inductive transformer is inversely proportional to the frequency of operation. This factor makes such transformers unsuitable for many low-frequency applications, including those in the VHF-UHF frequency range. For example, a discrete inductive transformer for operation at these frequencies may be as large as 3.8 mm×3.8 mm×3.8 mm.

When one attempts to integrate such devices onto the circuit chip instead, a different set of problems arises. One such problem is poor coupling between the primary and secondary coils (i.e. a low value of M), which results in low conversion efficiency. Other problems include dissipative loss in metal conductors; losses due to low substrate resistance, including those caused by capacitative and magnetic coupling of the inductor to the substrate; and a large occupied chip area thereby increasing the cost of the entire integrated circuit.

At RF frequencies, the differential to single-ended conversion may also be performed by using a half-wavelength transmission line. In the VHF and UHF ranges, however, this approach is not feasible for many applications because of the physical length of the line required (even at f=1 GHz, for example, $\lambda/2$=15 cm). In such cases, a lumped equivalent circuit such as the LCL pi network shown in FIG. 3 may be used to create the same effect. Note that while a LCL version is shown here, a CLC version may also be used to obtain the same result.

Figure 3:
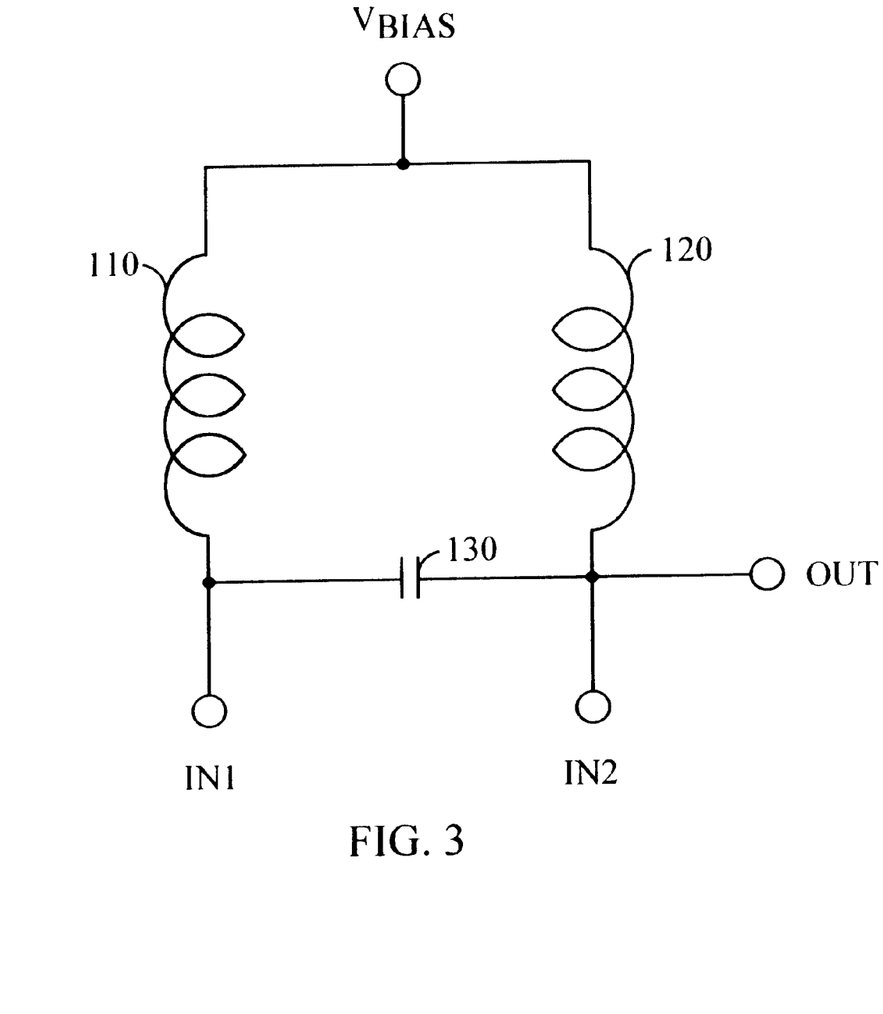
FIG. 3 is a second example of a converter in the related art.
Figure 4A:
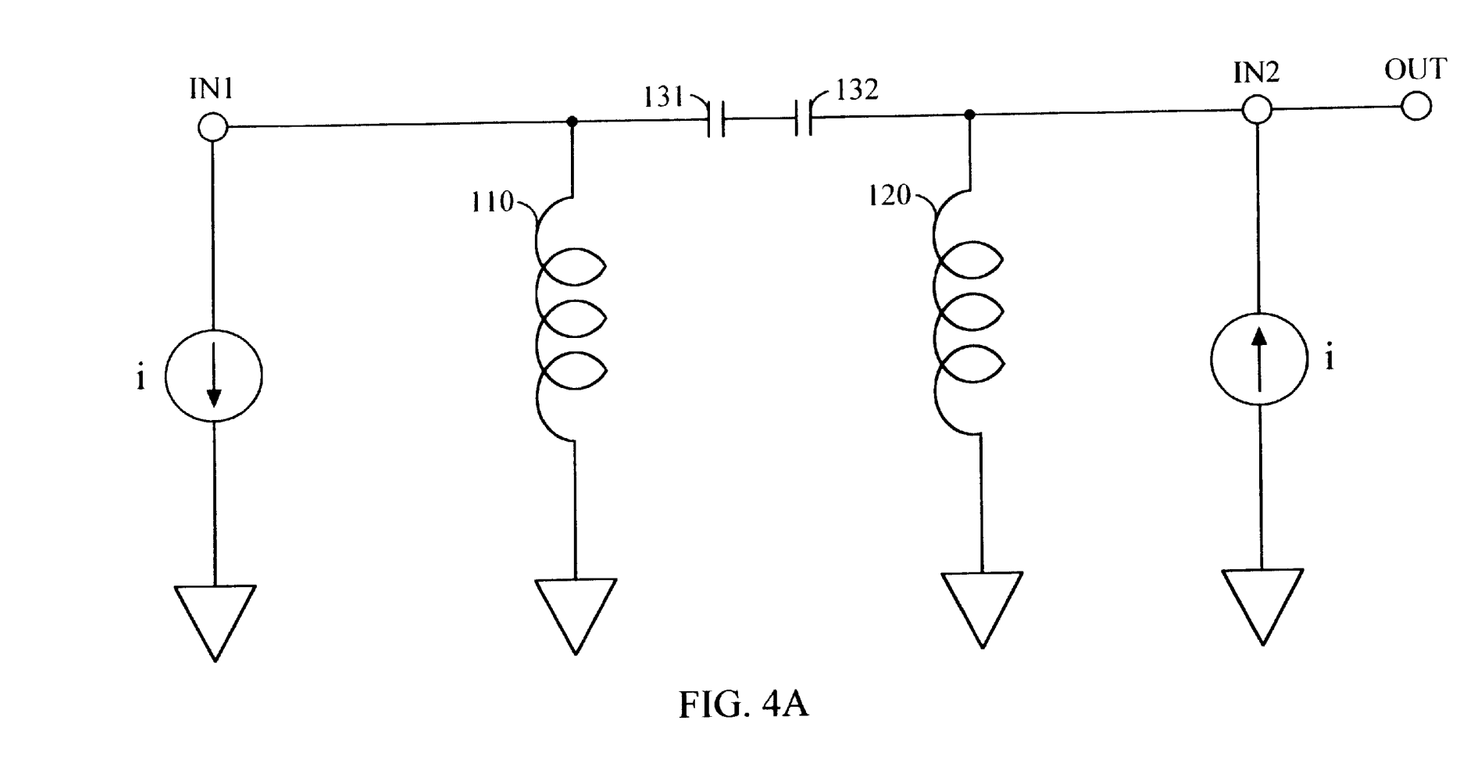
FIG. 4A is a small-signal equivalent of the circuit in FIG. 3.
Figure 4B:
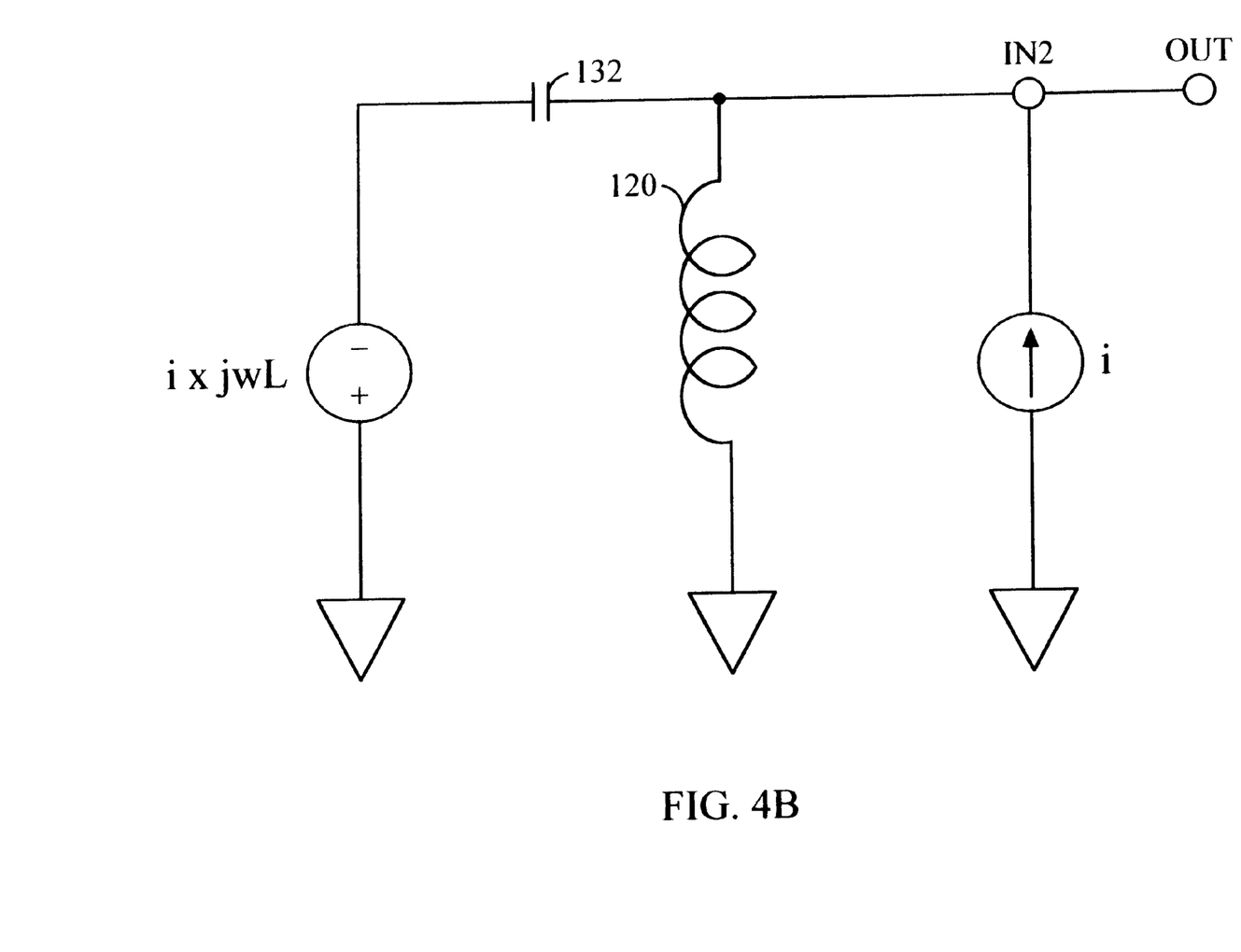
FIG. 4B is an equivalent of the circuit in FIG. 3.
Figure 4C:
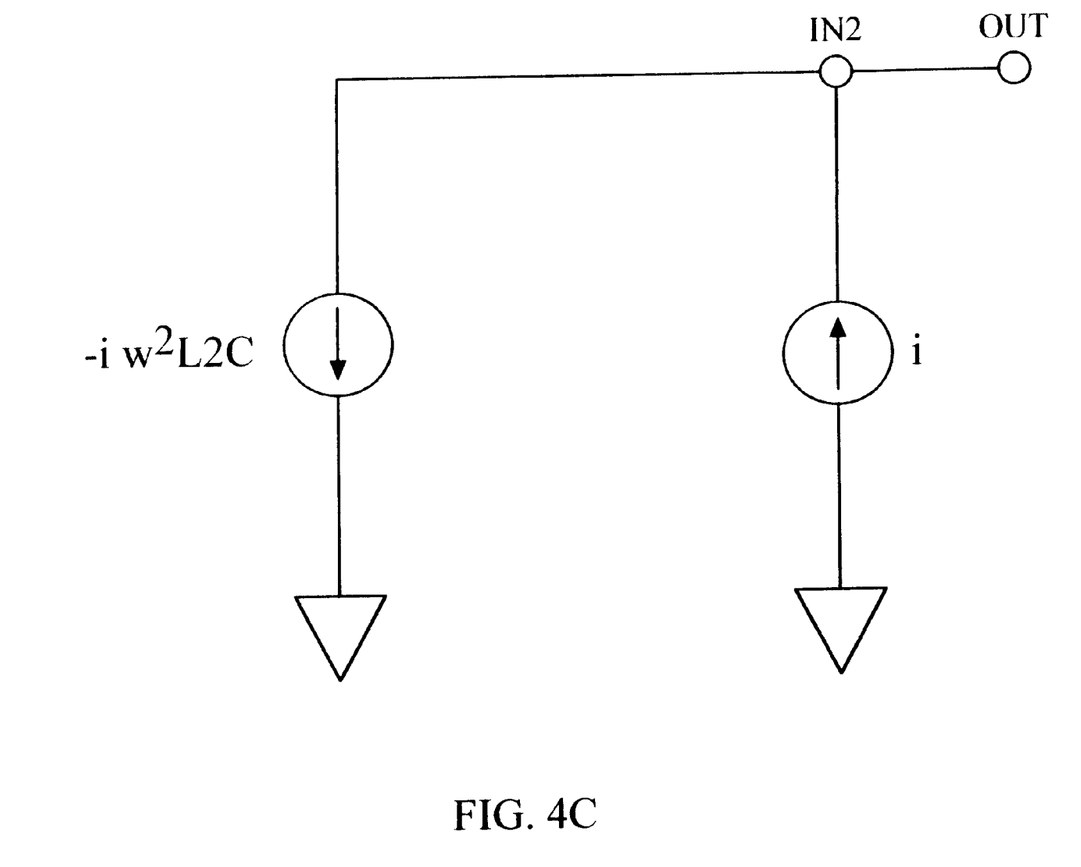
FIG. 4C is another equivalent of the circuit in FIG. 3.

In contrast to the inductive transformer described above, which converts input currents to an output voltage, the half-wavelength transmission line and the equivalent pi circuit of FIG. 3 work by inverting the phase of one of the input currents. As described in the technical article "Current combiner enhances active mixer performance" by Alvin K. Wong, Sheng H. Lee, and Michael G. Wong, *Microwaves & RF*, March 1994, pp. 156–165, which article is hereby incorporated by reference, this operation may be verified through the following decomposition of FIG. 3:

obtain the equivalent circuit in FIG. 4A by applying two AC current sources having the same magnitude i but 180 degrees out of phase at nodes IN1 and IN2, replacing capacitor 130 (of value C) with its equivalent of two capacitors 131 and 132 (each of value 2C) connected in series, and noting that the inductors 110 and 120 are shunts to ground for AC signals;

replace the parallel combination of the current source applied at node IN1 (of value i) and inductor 110 (of value L) with its Thevenin equivalent of a series combination of a voltage source of value $i \times j\omega L$ and an inductor of value L;

note that at resonant frequency $\omega_0$, the series combination of an inductor of value L and capacitor 131 (of value 2C) appears to be a short circuit, and perform this substitution to obtain FIG. 4B;

replace the series combination of the voltage source of value $i \times j\omega L$ and capacitor 132 (of value 2C) with its Norton equivalent of a parallel combination of a current source of value $-i\omega^2 L2C$ and a capacitor of value 2C;

note that at resonant frequency $\omega_0$, the parallel combination of inductor 120 (of value L) and a capacitor of value 2C appears to be an open circuit, and perform this substitution to obtain FIG. 4C;

note that at resonant frequency $\omega_0$, the expression $-i\omega^2 L2C$ reduces to $-i$, and substitute $-i$ for the value of the current source obtained in the previous step. By changing $-i$ to $i$ in order to reverse the direction of the current flow arrow for this source, we see that the two sources in FIG. 4C are identical and that their currents add in sum at output node OUT. In this way the circuit changes the phase of the current applied to IN1 to match that of the current applied at IN2 and thus combines the two currents.

Figure 5:
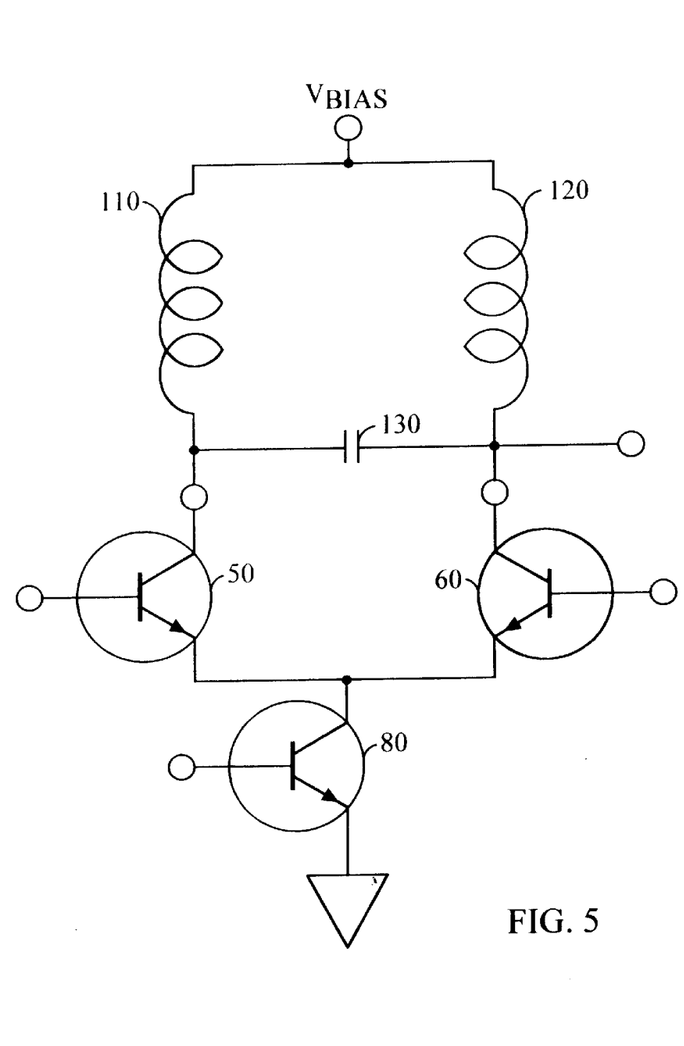
FIG. 5 is a representative application for the converter of FIG. 3.

As a representative use for such a converter, FIG. 5 shows a downconverter mixer which converts an input RF signal to a intermediate frequency (IF). A local oscillator (not shown) produces a differential voltage signal of frequency $f_{LO}$ defined as the voltage between $V_{LO}+$ and $V_{LO}-$. This voltage signal is converted into an alternating bias current by differential pair 50 and 60. Input RF signal m is applied to the base of current source 80, causing the bias current of the active devices 50 and 60 to vary with the amplitude of m as well as with the amplitude of the differential signal. In this case, $f_{LO}$ is chosen so that $f_{LO} > f_m$. The output signal at node OUT thus contains a component at frequency $(f_{LO}+f_m)$, which is removed by lowpass filtering (not shown), and another component at the intermediate frequency $(F_{LO}-f_m)$ which is modulated in substantially the same fashion as input signal m.

Although a discrete implementation of this lumped equivalent circuit is much smaller than an inductive transformer or a half-wavelength transmission line for the same frequency, it would still be relatively large for use in the VHF-UHF range because of the inductors. Such use of off-chip components would also cause additional fabrication and assembly costs.

This circuit would not be suitable for integration either, although in this case no inductive coupling is needed. Inductors fabricated on IC chips suffer from a poor 'quality factor' (or 'Q factor'), calculated as the ratio of reactance to resistance and defined as the ratio of the energy stored by the circuit per cycle of the resonant frequency to the power dissipated by the circuit [i.e., $(\omega \times E_{st})/P_{diss}$]. In order to compensate for this shortcoming, wide inductor traces must be used to reduce resistive loss. An increase in trace width, however, results in a squared increase in chip area consumed. Moreover, in order to avoid crosstalk, other signal traces cannot be placed over this area and must be routed around it instead, causing additional problems in circuit layout and space utilization efficiency.

A chip-level inductor having an increased area encounters other problems as well. The silicon substrate is conductive, so AC current flow in the coil generates eddy currents in the substrate. The resulting dissipative losses increase with the area covered by the coil. Therefore, on-chip fabrication of inductors requires a tradeoff between several detrimental effects, and the end result is that high-Q components cannot be obtained.

Because of the factors described above, the practical upper limit for inductors on silicon chips is approximately 15 to 20 nH. For applications in the VHF range, however, inductances of hundreds of nanohenrys are required. For example, to achieve the differential-to-single-ended conversion at 70 MHz using the circuit in FIG. 3, with capacitor 130 having a value of 130 pF, the value of each inductor 110 and 120 should be 258.5 nH. Therefore, monolithic implementation of this converter for use in RF applications at such frequencies is not feasible.

In addition to these implementational barriers, problems also arise regarding the performance of this converter circuit. For example, the loading of the inputs is not symmetrical, as the input at node IN1 sees a larger impedance than the input at node IN2. This effect causes a circuit imbalance, reducing the common-mode rejection by the circuit and making it prone to common-mode interferences or noise. In mixers, this imbalance would also affect such important characteristics as rejection of the local oscillator leakage and other spurious responses. Also, the 180-degree phase shift of the current at node IN1 is strictly valid only at $\omega_0$, so the conversion occurs only in a very narrow frequency range determined by the loaded Q factor of the LC resonators. Moreover, additional passive components are required to match the output impedance to the load impedance.

SUMMARY OF THE INVENTION

A converter after the present invention contains no inductors and can readily be implemented in any IC fabrication process. Because the input impedances are equal, the inputs are symmetrically loaded and a balanced operation is maintained. High output efficiency is realized by matching the output impedance to the load impedance without requiring additional components. The circuit's operating bandwidth is also much wider than for the purely reactive converters described above. The conversion gain can easily be increased without disrupting the output-to-load impedance match, so long as the signal frequency is within the operating bandwidth, simply by changing the value of a circuit resistance.

DETAILED DESCRIPTION OF THE INVENTION

Figure 6:
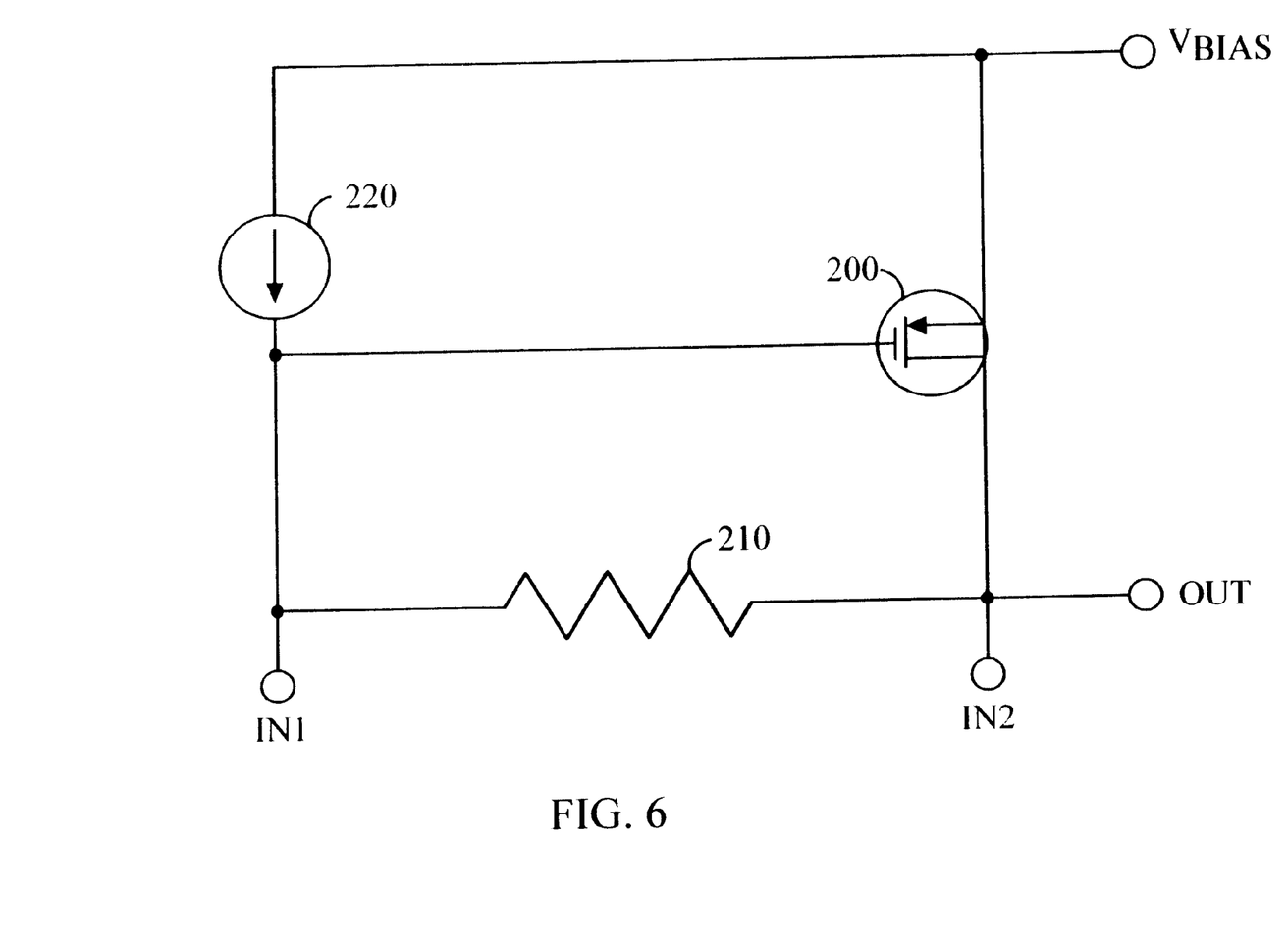
FIG. 6 is an illustration of a circuit after the first embodiment of the invention.
Figure 7:
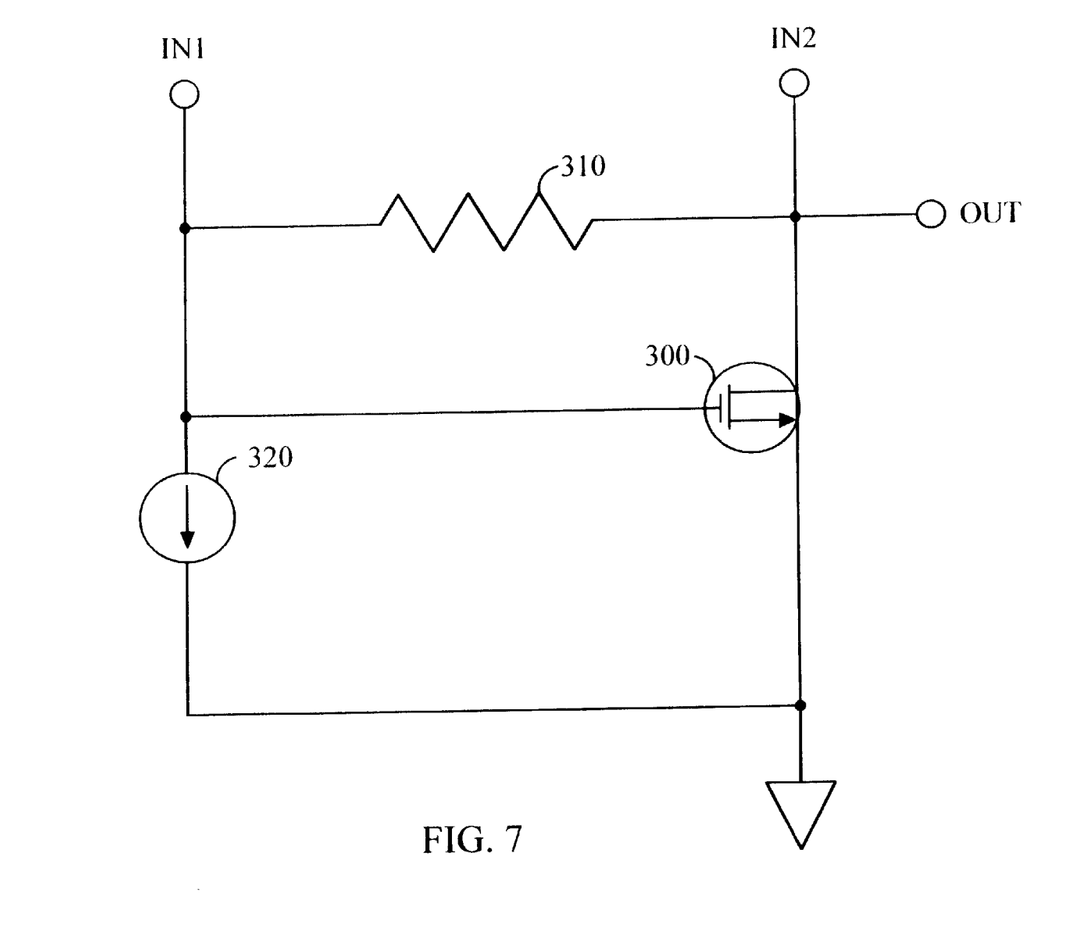
FIG. 7 is a complementary version of the circuit in FIG. 6.

As shown in FIG. 6, the first embodiment of the invention comprises an active device 200 in a common-source configuration, with the gate and drain of active device 200 connected to the first and second signal inputs, respectively. The drain of active device 200 is also connected to the single-ended signal output. A resistance 210 is added between the input nodes IN1 and IN2 to provide a closed-loop path for the input AC current, and a DC current source 220 supplies current from the node at potential $V_{bias}$ to input node IN1. A complementary version of the first embodiment is shown in FIG. 7.

Operation of this circuit is different than that of either related art circuit discussed above. Specifically, it does not operate by the inductive conversion of current to voltage (as there are no inductors), or by inverting the phase of any current.

Figure 8:
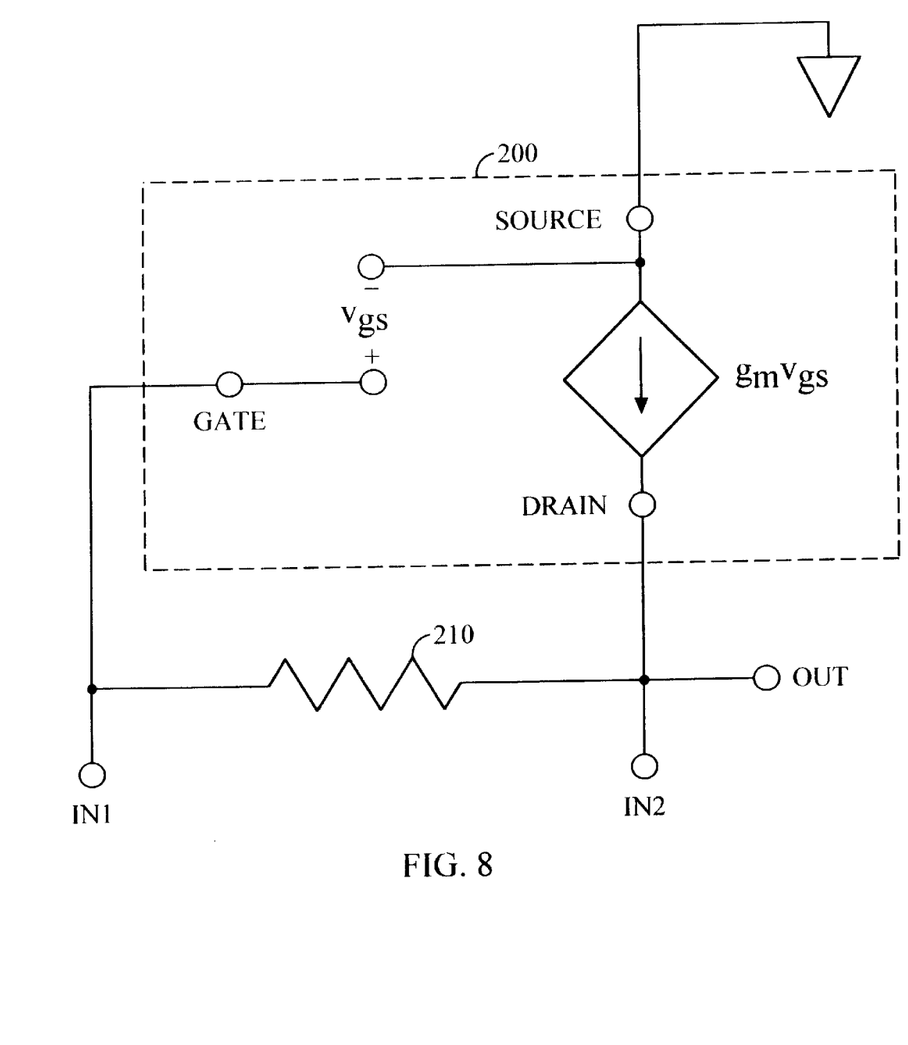
FIG. 8 is a small-signal equivalent of the circuit in FIG. 6.

Consider the small-signal equivalent circuit as shown in FIG. 8. As source 320 is assumed ideal, no AC current flows through it. Also, DC bias node $V_{bias}$ is effectively at AC ground potential. To determine the circuit's output impedance, we leave the inputs unconnected. Because no current flows through resistor 210, nodes IN1, IN2, and OUT and the gate and drain terminals of active device 200 are all at the same potential.

An AC voltage $V_{test}$ applied at node OUT causes active device 200 to generate a current $g_m \times V_{test}$, $(=-g_m \times V_{gs})$ flowing through node OUT. Therefore, the impedance of the circuit is 1/gm, where $g_m$ is the transconductance of the active device 200. By choosing $g_m$ to be the reciprocal of the load impedance, we thus match the output and load impedances without adding any components that could affect the circuit's conversion efficiency.

Figure 9:
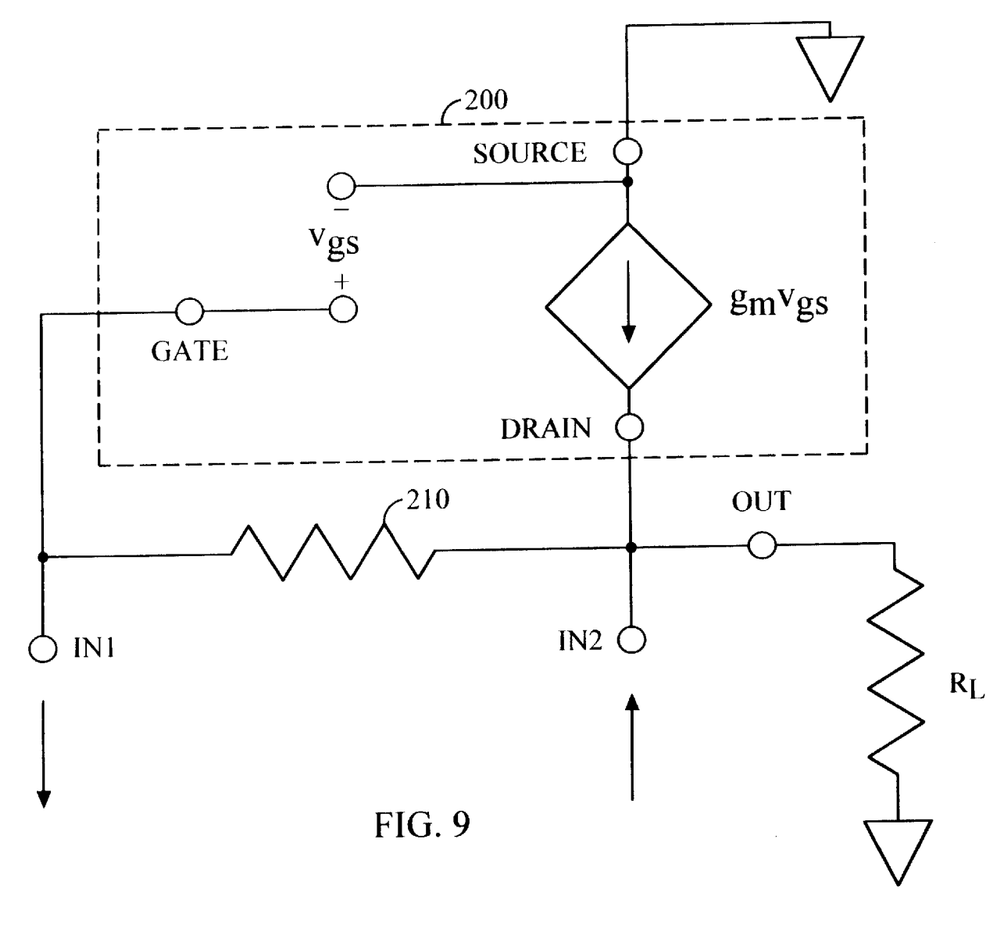
FIG. 9 is an illustration of a circuit after the first embodiment of the invention in normal operation.

In normal operation, nodes IN1 and IN2 are driven by a pair of AC current sources which have the same magnitude and are 180 degrees out-of-phase (active devices 50 and 60 in FIG. 2 are one example of such a pair). Assume that current $i_{IN1}$ flows out of node IN1, while current $i_{IN2}$ flows into node IN2, as shown in FIG. 9. As the only available AC path for current $i^{IN1}$ is through resistance 210, it follows that current $i_{IN1}$ flows out of node IN2. Because $i_{IN1}=i_{IN2}$, we may assume that all of the AC input current flows through resistance 210, and that none of it flows through the active device 200 or through the load.

Thus we can see that the current generated by the active device 200, $g_m \times V_{gs}$, flows only through the load, thereby creating a voltage $g_m \times V_{gs} \times R_L$ at node OUT, which is the same node as node IN2. Because we have chosen $g_m$ to be $1/R_L$, it follows that $V_{IN2}=V_{gs}$. Further, because $V_{gs}=-V_{IN1}$, we have $V_{IN2}=-V_{IN1}$. Now, as $i_{IN1}$ and $i_{IN2}$ are equal but antiparallel, we can obtain such equal but antiparallel input voltages only as a result of equal input impedances at nodes IN1 and IN2. In other words, $Z_{IN1}=Z_{IN2}$, and the circuit is balanced in normal operation.

The conversion gain of the circuit is the ratio of the voltage at node OUT to the input differential current signal. Because our input signal flows only through resistance 210, we can express it as the ratio of the voltage drop across resistance 210 to the value of resistance 210 (which we now designate as R). Knowing that the voltage at node OUT is $V_{IN2}$, we can therefore express the conversion gain as $(V_{IN2} \times R)/(V_{IN2}-V_{IN1})$. As $V_{IN2}=-V_{IN1}$, we conclude that the conversion gain of the circuit is R/2.

At high frequencies, a complete analysis of the circuit's performance will take the capacitances of the active device into account. We therefore consider the effect of the most significant of these capacitances: the gate-source capacitance $C_{gs}$. We first determine ωr, the frequency of unity current gain for the active device, where $\omega = g_m/C_{gs}$. For PMOS and PNP devices, ωr is typically in the range of 200–300 MHz, while for NMOS and NPN devices ωr is typically 20–60 GHz.

We may now obtain the following modified expression for the conversion gain of the circuit:

$$\frac{R}{2} \cdot \frac{1+\frac{j\omega}{\omega_T}}{1+\frac{j\omega}{2\omega_T}\left(1+\frac{R}{R_L}\right)}.$$

We may also obtain the 3 dB bandwidth for the circuit as $$\omega_{3dB} = \frac{\omega_T}{\sqrt{\frac{1}{4}\left(1+\frac{R}{R_L}\right)-2}}.$$

Given the typical values for car noted above, we may easily see that by proper selection of R, we may obtain a very large value for $\omega_{3dB}$, much larger than any such value that may be obtained with the circuit of FIG. 3.

Note that the DC current source 220 does not appear in the small-signal analysis, as it serves only to provide bias current to the source connected to node IN1. As such, it may comprise any circuit which passes DC but has a high impedance at the operating frequencies, such as a parallel LC resonator or a quarter-wavelength transmission line.

Figure 11:
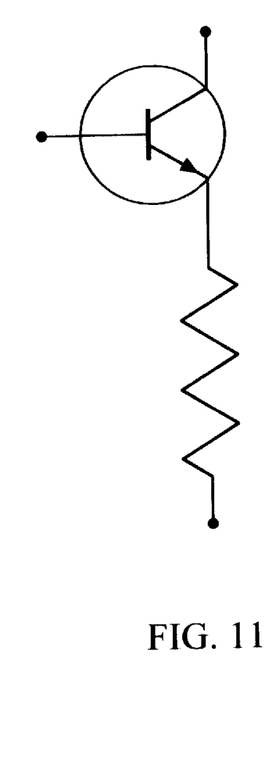
FIG. 11 is an illustration of a degenerated-emitter bipolar junction transistor.

The novel circuit herein described may be used in conjunction with any circuit producing a differential current signal: for example, a differential gain stage or a balanced mixer. Likewise, the active device 200 is not limited to an insulated-gate FET or MOSFET as shown, but is equally suitable for use with any other device that may be configured as a voltage-dependent current source, such as a FET, a bipolar junction transistor (BJT), a heterojunction BJT fabricated e.g. in GaAs or SiGe, a MESFET, a high-electron-mobility transistor (HEMT), or a degenerated transistor of any of these types. An example of a degenerated-emitter BJT suitable for use as active device 200 is illustrated in FIG. 11.

Figure 10:
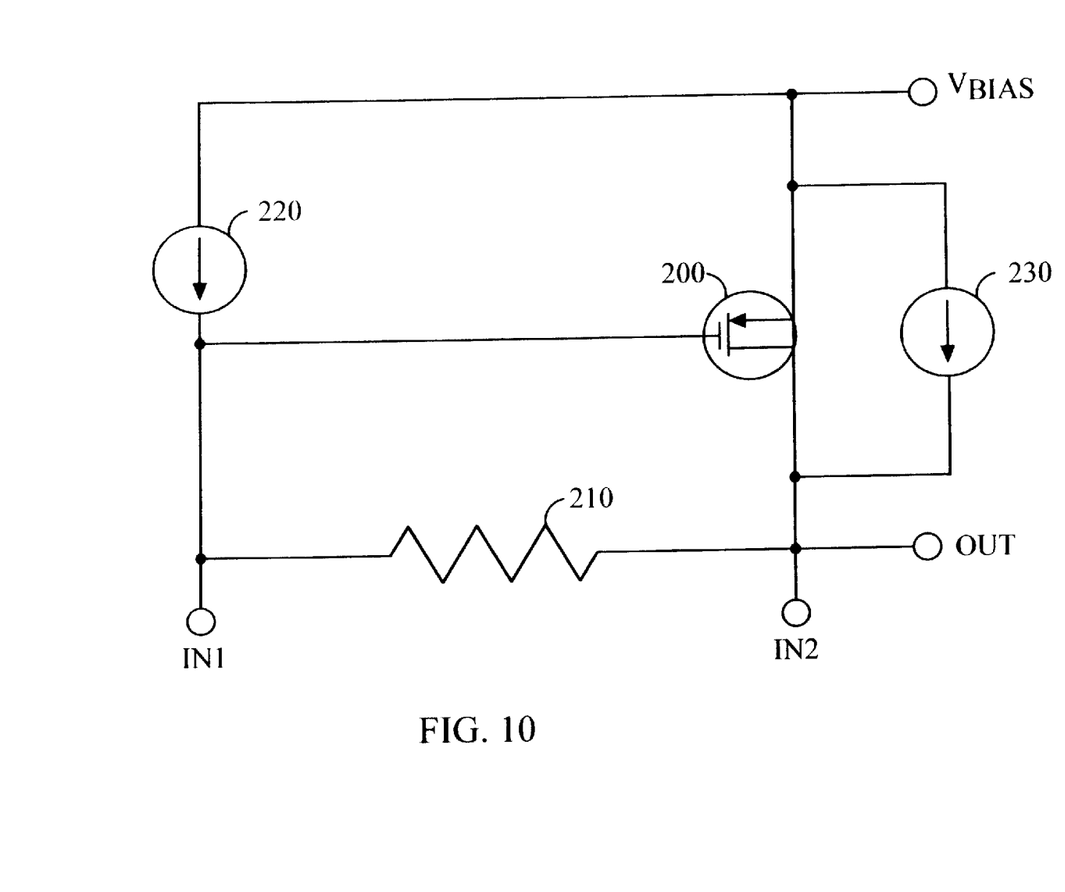
FIG. 10 is an illustration of a circuit after the second embodiment of the invention.

In some applications, the current supplied by active device 200 may be insufficient as a DC bias current for the device connected to node IN2. In such cases, the second embodiment of the invention may be used. In this embodiment, as illustrated in FIG. 10, a second DC current source 230 is used to supplement the DC current available at node IN2. As noted above with respect to the first DC current source, this second DC current source does not appear in the small-signal analysis and may comprise any circuit which passes DC but has a high impedance at the operating frequencies.

The foregoing description of the preferred embodiments is provided to enable any person skilled in the art to make or use the present invention. Various modifications to these embodiments will be readily apparent to those skilled in the art, and the generic principles presented herein may likewise be applied to other embodiments without use of the inventive faculty. Thus, the present invention is not intended to be limited to the embodiments shown above but rather is to be accorded the widest scope consistent with the principles and novel features disclosed in any fashion herein.

What is claimed is:

1. A circuit for converting a differential current signal to a single-ended signal, comprising:
    an active device having a control terminal, a charge-producing terminal, and a charge-collecting terminal; and
    a resistance having two terminals;
    wherein a bias potential is applied at least indirectly to the charge-producing terminal of said active device; and
    wherein one of the two terminals of said resistance is connected to the charge-collecting terminal of said active device, and the other of the two terminals of said resistance is connected to the control terminal of said active device; and
    wherein the differential current signal is applied to the terminals of the resistance, and the single-ended signal is outputted at the charge-collecting terminal of said active device.

2. A circuit for converting a differential current signal to a single-ended signal according to claim 1, wherein said active device is a field-effect transistor.

3. A circuit for converting a differential current signal to a single-ended signal according to claim 1, wherein said active device is a bipolar junction transistor.

4. A circuit for converting a differential current signal to a single-ended signal according to claim 1, wherein said active device is selected from the group consisting of a metal-semiconductor field-effect transistor, a heterojunction bipolar junction transistor, and a high-electron-mobility transistor.

5. A circuit for converting a differential current signal to a single-ended signal according to claim 1, further comprising a direct current source having two terminals, wherein the bias potential is applied to one of the two terminals of said direct current source, and the other of the two terminals of said direct current source is connected to the control terminal of said active device.

6. A circuit for converting a differential current signal to a single-ended signal according to claim 5, wherein said active device is a field-effect transistor.

7. A circuit for converting a differential current signal to a single-ended signal according to claim 5, wherein said active device is a bipolar junction transistor.

8. A circuit for converting a differential current signal to a single-ended signal according to claim 5, wherein said active device is selected from the group consisting of a metal-semiconductor field-effect transistor, a heterojunction bipolar junction transistor, and a high-electron-mobility transistor.

9. A circuit for converting a differential current signal to a single-ended signal according to claim 5, wherein said direct current source comprises a high-impedance circuit.

10. A circuit for converting a differential current signal to a single-ended signal according to claim 5, wherein said direct current source comprises a resonant circuit having an inductor and a capacitor connected in parallel to said inductor, wherein said resonant circuit has a high impedance.

11. A circuit for converting a differential current signal to a single-ended signal according to claim 5, wherein said direct current source comprises a quarter-wavelength transmission line.

12. A circuit for converting a differential current signal to a single-ended signal according to claim 1, further comprising a direct current source having two terminals, wherein the bias potential is applied to one of the two terminals of said direct current source, and the other of the two terminals of said direct current source is connected to the charge-collecting terminal of said active device.

13. A circuit for converting a differential current signal to a single-ended signal according to claim 12, wherein said active device is a field-effect transistor.

14. A circuit for converting a differential current signal to a single-ended signal according to claim 12, wherein said active device is a bipolar junction transistor.

15. A circuit for converting a differential current signal to a single-ended signal according to claim 12, wherein said active device is selected from the group consisting of a metal-semiconductor field-effect transistor, a heterojunction bipolar junction transistor, and a high-electron-mobility transistor.

16. A circuit for converting a differential current signal to a single-ended signal according to claim 12, wherein said direct current source comprises a high-impedance circuit.

17. A circuit for converting a differential current signal to a single-ended signal according to claim 12, wherein said direct current source comprises a resonant circuit having an inductor and a capacitor connected in parallel to said inductor, wherein said resonant circuit has a high impedance.

18. A circuit for converting a differential current signal to a single-ended signal according to claim 12, wherein said direct current source comprises a quarter-wavelength transmission line.

19. A circuit for converting a differential current signal to a single-ended signal according to claim 1, further comprising a first direct current source having two terminals and a second direct current source having two terminals, wherein the bias potential is applied to one of the two terminals of said first direct current source, and the other of the two terminals of said first direct current source is connected to the control terminal of said active device, and wherein the bias potential is applied to one of the two terminals of said second direct current source, and the other of the two terminals of said second direct current source is connected to the charge-collecting terminal of said active device.

20. A circuit for converting a differential current signal to a single-ended signal according to claim 19, wherein said active device is a field-effect transistor.

21. A circuit for converting a differential current signal to a single-ended signal according to claim 19, wherein said active device is a bipolar junction transistor.

22. A circuit for converting a differential current signal to a single-ended signal according to claim 19, wherein said active device is selected from the group consisting of a metal-semiconductor field-effect transistor, a heterojunction bipolar junction transistor, and a high-electron-mobility transistor.

23. A circuit for converting a differential current signal to a single-ended signal according to claim 19, wherein at least one among said first and second direct current sources comprises a high-impedance circuit.

24. A circuit for converting a differential current signal to a single-ended signal according to claim 19, wherein at least one among said first and second direct current sources comprises a resonant circuit having an inductor and a capacitor connected in parallel to said inductor, wherein said resonant circuit has a high impedance.

25. A circuit for converting a differential current signal to a single-ended signal according to claim 19, wherein at least one among said first and second direct current sources comprises a quarter-wavelength transmission line.

* * * * *